Figure 1:
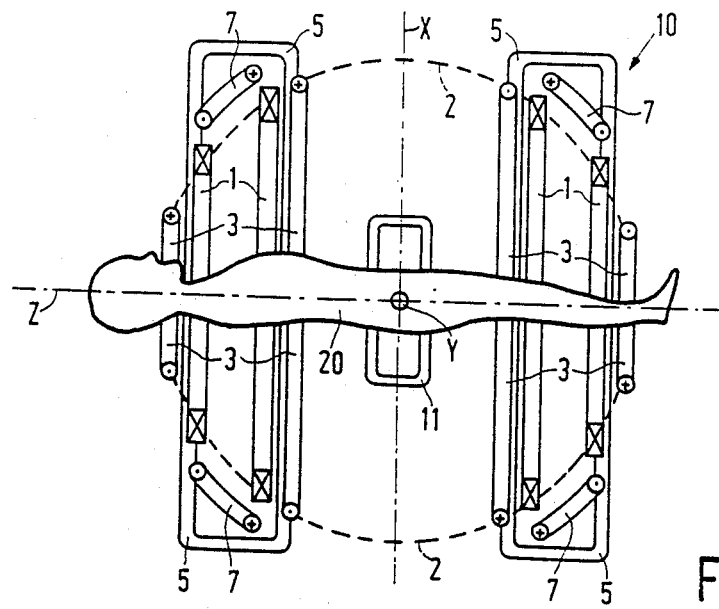

United States Patent [19]

McKinnon

[11] Patent Number: 4,818,941
[45] Date of Patent: Apr. 4, 1989

[54] MR TOMOGRAPHY METHOD AND APPARATUS FOR PERFORMING THE METHOD

[75] Inventor: Graeme C. McKinnon, Ellerau, Fed. Rep. of Germany

[73] Assignee: U.S. Philips Corporation, New York, N.Y.

[21] Appl. No.: 936,068

[22] Filed: Nov. 26, 1986

[30] Foreign Application Priority Data

Nov. 29, 1985 [DE] Fed. Rep. of Germany ....... 3542215

[51] Int. Cl.$^4$ ............................................ G01R 33/20
[52] U.S. Cl. .................................................. 324/309
[58] Field of Search ...................... 324/307, 309, 311; 128/653

[56] References Cited

U.S. PATENT DOCUMENTS

| | | | |
|---|---|---|---|
| 4,581,582 | 4/1986 | Redington | 324/309 |
| 4,585,992 | 4/1986 | Maudsley et al. | 324/309 |
| 4,607,223 | 8/1986 | Mallard et al. | 324/309 |
| 4,618,827 | 10/1986 | Redington et al. | 324/309 |

OTHER PUBLICATIONS

Dixon, W. T., "Single Proton Spectroscopic Imaging", Radiology, vol. 153, 1984, pp. 189–194.

Primary Examiner—Stewart J. Levy
Assistant Examiner—Kevin D. O'Shea

[57] ABSTRACT

An MR tomography method for generating water and fat images and an apparatus for performing the method. In one embodiment each sequence, consisting of a high-frequency pulse and different gradient fields, is executed twice, the gradient fields being influenced so that the distance between the high-frequency pulse and the echo signal in one execution of a sequence deviates from that in the other execution of the sequence by a given amount. Water images and fat images can thus be formed by summing and subtraction, respectively. In a second embodiment, two read phases are provided in each sequence.

7 Claims, 2 Drawing Sheets

MR TOMOGRAPHY METHOD AND APPARATUS FOR PERFORMING THE METHOD

The invention relates to MR tomography methods wherein echo signals are extracted during a plurality of sequences for the reconstruction of the spatial density distribution in an examination region, each sequence includng a selection phase during which a single high-frequency pulse is applied to the examination region in the presence of a magnetic gradient field, a subsequent encoding phase during which the examination region is exposed to a magnetic gradient field with a gradient which varies as regards magnitude or direction from one sequence to another, and a subsequent read phase during which the spin echo signal generated in the examination region is sampled in the presence of a magnetic gradient field, after which an image which is dependent on the proton distribution is calculated from the echo signal, the image values for the individual pixels of the image being determined by formation of the absolute value during a final step, and also relates to an apparatus for performing such a method.

A method and an apparatus of this kind are known from "Phys. Med. Biol.", Vol. 25 (1980), pages 751 to 756. Therein, inter alia a gradient field is generated between the selection phase and the read phase, the gradient thereof extending in the same direction but having the opposite sign with respect to the gradient of the gradient field which is active during the read phase. The time integral over this field has a defined value. When the absolute value of the integral during the read phase is the same, there will appear an echo signal which is used for the image reconstruction.

Because not only the amplitude but also the phase position of the echo signal is important for the reconstruction, the echo signal is generally divided into two signal components which have been phase shifted 90° with espect to one another and which are subjected, together with the corresponding components of the echo signals obtained during the other sequences, to a Fourier transformation wherefrom an image value which again consists of two components is derived for each pixel. The relative magnitude of these components depends inter alia on the strength of the magnetic field in the relevant pixel. Therefore, due to field inhomogeneities the two components may have a different value for two pixels which are spaced apart, even though in both cases the same proton density exists in the examination region. Errors in the reconstructed image are avoided, however, by forming the absolute value from the two components (by summing the squaares of the two components).

The above known method, often also referred to as the spin warp method, enables fast detection of the echo signals, because only one high-frequency pulse is applied in each sequence. On the other hand, such a method gives rise to contrast errors when fat and water are both present in the examination region. This is because the Larmor frequency of water-bound hydrogen protons (herinafter this frequency is also referred to as "water frequency") and the Larmor frequency of fat-bound hydrogen protons (also referred to hereinafter as "fat frequency") differ approximately 3.3 ppm, thus giving rise to the described errors. When such contrast errors are to be avoided, it will be necessary to form either an image which is independent of the fat distribution (this image is also referred to hereinafter as "fat image") or an image which is independent of the water distribution (this image is also referred to hereinafter as "water image").

A method of generating water images and fat images is known from "Radiology", Vol. 153 (1984), pages 189 to 194. According to the known method, a first 90° pluse in the selection phase is followed by a 180° high-frequency pulse after the encoding phase. Thus, a (spin) echo signal is generated at a distance from the 180° pulse which correspons to the distance in time between the 180° pulse and the 90° pulse. Each sequence is executed twice, the distance in time between the two high-frequency pulses in the one execution of the sequence being shifted with respect to the corresponding distance in the other execution of the sequence over a period of time which equals one quarter of the reciprocal value of the difference between the water frequency and the fat frequency. The echo signals occurring in each of the two executions of the sequence are used for the reconstruction of a respective image. The water image or fat image is obtained from these two images by summing or subtraction. Contrary to the previously described method, the present method does not require formation of the absolute value.

It is a drawback of this method of forming separate fat or water images that each execution of each sequence includes not only a 90° pulse but also a 180° pulse. This high-frequency pulse contains a comparatively large amount of energy, which may give rise to undesirable heating of the examination region. Moreover, the duration of the sequences is comparatively long.

It is an object of the invention to realize a method of the kind set forth so that separate fat images and water images can be generated by means of only one high-frequency pulse per execution of each sequence.

A first method of achieving this object consists in that each sequence is executed twice, the gradient field during the read phase in the second execution of each sequence, or the gradient field previously extending in the opposite direction, being proportioned (that is, during the read phase the gradient field in one sequence is larger than that in the other sequence) so that the distance in time between the high-frequency pulse and the echo signal in the second execution is shifted with respect to the echo signal in the first execution of the sequence over a period of time which corresponds to half the reciprocal value of the difference between the Larmor frequencies of water-bound and fat-bound hydrogen protons, respectively, an image of the density distribution in the examination region being calculated from the sums of or the differences between the echo signals formed during the two executions.

A second method of achieving this object consists in that each sequence includes two read phases during which the gradient field has the same direction, each of the read phases being preceded by a period of time during which the gradient field extends in the opposite direction with respect to its direction during the read phase, the variation in time of the gradient field being chosen so that the echo signal occurring during the second read phase is shifted with respect to the echo signal occurring during the first read phase over a period of time which corresponds to half the reciprocal value of the difference between the Larmor frequencies of water-bound and fat-bound hydrogen protons, respectively, or to an odd multiple thereof, an image of the density distribution in the examination region being calculated from the sums of or the differences between the echo signals formed during the two sequences.

The invention is based on the recognition of the fact that the distance in time between the echo signal and the high-frequency pulse depends on the gradient field during the read phase or the gradient field previously acting in the opposite direction. By suitably varying one of the gradient fields, or both fields, the distance in time between the echo signal and the high-frequency pulse can be varied (hereinafter, the term "distance in time" between pulses or signals to be understood to mean the distance in time between the time centres of the signals). The components of the echo signals relating to the water component occupy the same phase position in the two sequences when the frequency of the high-frequency pulse corresponds to the water frequency. The components of the two echo signals relating to the fat component, however, occupy an opposed phase position when the shift of the echo signal corresponds exactly to half the reciprocal value of the difference between the Larmor frequencies of fat and water as a result of the described variation of the gradient field. Therefore, when the density distribution is reconstructed by means of the sum of or the difference between the echo signals of the two executions of sequences, a water image or a fat image, respectively, will be obtained.

According to the first method, the two echo signals are generated in two executions of each sequence (only one echo signal being sampled for each high-frequency pulse); however, according to the second solution both echo signals are generated in only one execution of each sequence (that is to say by only one high-frequency pulse). The second solution is faster because it requires only half the number of executions, but will lead to a deteriorated spatial resolution unless the time intergal over the respective magnetic gradient field active during the read phases need not be decreased during a half-oscillation.

The sum or the difference can be formed by first summing or subtracting the two subtracting the two echo signals, followed by the execution of a customary reconstruction method, for example a Fourier transformation. However, because such a reconstruction method is a linear process, it is also possible to use the two sequences for generating two images which are subsequently pixel-wise summed or subtracted in order to form the sum of or the difference between the echo signals of the two sequences. In both cases the absolute value must subsequently be formed for each pixel.

An apparatus for performing the one method includes means for generating a steady, uniform magnetic field, a high-frequency coil system for generating high-frequency pulses, gradient coils for generating magnetic fields which extend in the direction of the steady field and which have gradients in the same direction as well as in the direction perpendicular thereto, a sampling device for receiving echo signals generating in an examination region, a control unit for controlling the gradient coils, the high-frequency coil system and the sampling device, as well as a reconstruction unit which calculates an image of the spatial spin distribution from the echo signals, and is characterized in that the control unit is programmed so that each sequence is executed twice, the gradient coils being controlled so that the distance between the echo signal and the high-frequency pulse is shifted over a period of time (T) which corresponds to half the reciprocal value of the difference between the fat frequency and the water frequency, the reconstruction unit being constructed so that it determines the image on the basis of the sum of or the difference between the echo signals.

An apparatus for performing the other method includes means for generating a steady, uniform magnetic field, a high-frequency coil system for generating high-frequency pulses, gradient coils for generating magnetic fields which extend in the direction of the steady field and which have gradients in the same direction as well as in the direction perpendicular thereto, a sampling device for receiving echo signals generated in an examination region, a control unit for controlling the gradient coils, the high-frequency coil system and the sampling device, as well as a reconstruction unit which calculates an image of the spatial spin distribution from the echo signals, and is characterized in that the control unit is programmed so that each sequence includes two read phases during which the gradient field has the same direction, each of the read phases being preceded by a period of time during which the gradient field extends in the opposite direction with respect to its direction during the read phase, the variation in time of the gradient field being chosen so that the echo signal occurring during the second read phase is shifted with respect to the echo signal occurring during the first read phase over a period of time which corresponds to half the reciprocal value of the difference between the Larmor frequencies of water-bound and fat-bound hydrogen protons, respectively, or to an odd multiple thereof, the reconstruction unit being constructed so that it determines the image on the basis of the sum of or the difference between the echo signals.

Figure 2:
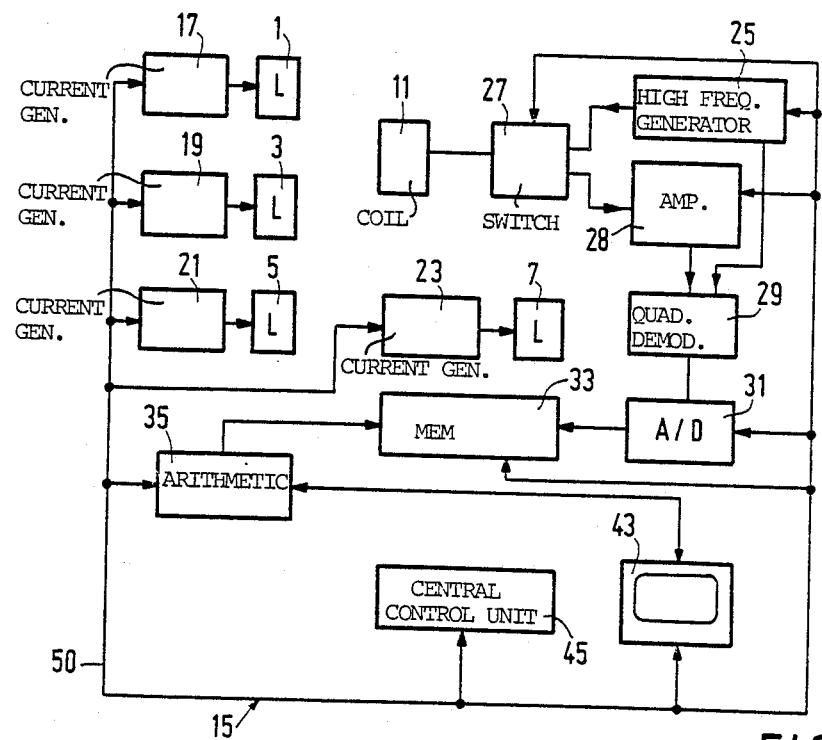
Figure 3:
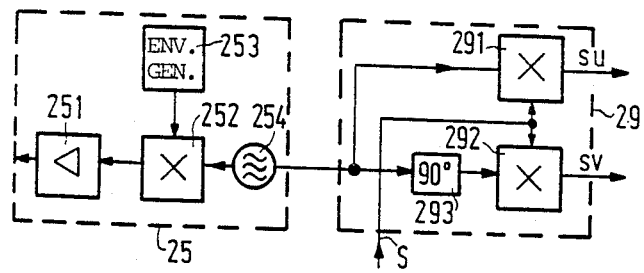
Figure 4A:
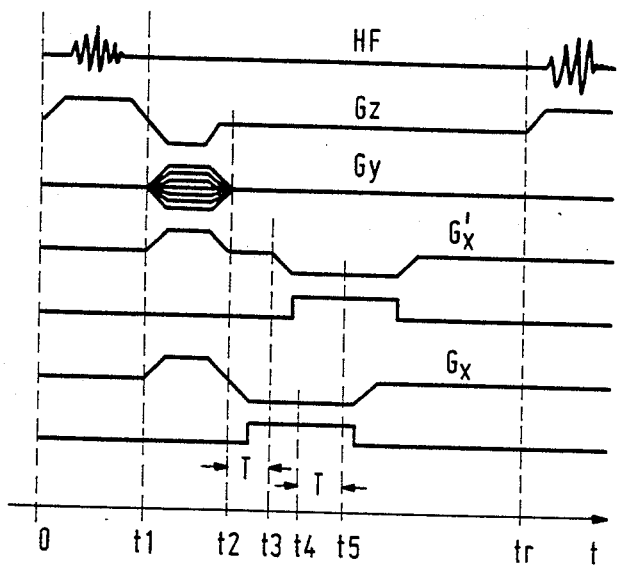
Figure 4B:
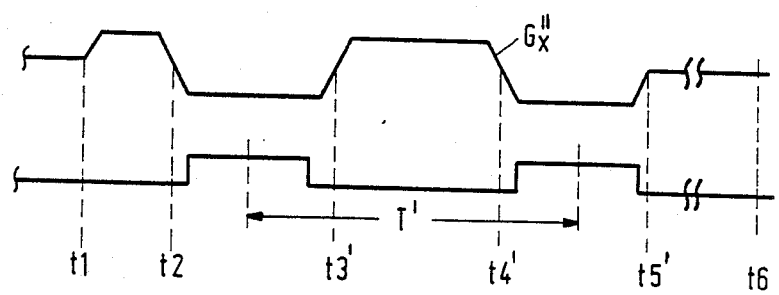
Figures 5A, 5B:
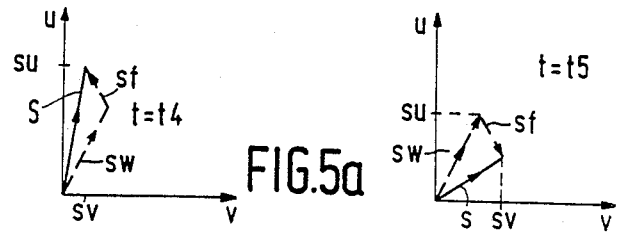

The invention will be described in detail hereinafter with reference to the drawing. Therein:

FIG. 1 shows the position in space of the coil systems required for generating the various magnetic fields in an MR tomography apparatus, FIG. 2 shows a block diagram of such an MR tomography apparatus, FIG. 3 shows a block diagram of a part of the apparatus shown in FIG. 2, FIGS. 4a and 4b show the variation in time of different magnetic fields and signals, respectively, and FIGS. 5a and 5b show a vector diagram of the echo signals at different instants.

The coil system shown in FIG. 1 includes four main coils 1 which are arranged on the surface of a sphere 2 whose centre is situated at the origin of the cartesian x, y, z coordinate system shown, the axes of the main coils 1 coinciding with the z-axis. The four coils form a magnet which generates a uniform, steady magnetic field which extends in the z-direction. The induction of this magnetic field may amount to some Tesla when use is made of superconducting coils; otherwise the induction generally amounts to less than 1 Tesla.

In order to generate a magnetic gradient field Gz which extends in the z-direction, that is to say a magnetic field which also extends in the z-direction and which has a constant gradient in this direction, there are provided four coils 3 which are preferably arranged on the same spherical surface. Four further coils 7 generate a magnetic field Gx which also extends in the z-direction and which has a constant gradient in the x-direction. There are also provided four further coils 5 which may be identical to the coils 7 but which are arranged so as to be shifted through an angle of 90° with respect thereto. The drawing shows only two of the four coils 5 which generate a magnetic field Gy which also extends in the z-direction and which has a gradient in the y-direction.

Furthermore, a high-frequency coil 11 is symmetrically arranged with respect to the plane z=0 of the coordinate system. It is constructed so that it generates an essentially uniform, high-frequency magnetic field extending in the x-direction.

The currents for the coils 1, 3, 5 and 7 are generated by generators 17, 19, 21 and 23, respectively, which are controlled by a central control units 45. This unit also controls a high-frequency generator 25, a switch 27 via which the high-frequency generator 25 can be coupled to the high-frequency coil 11, an amplifier 28 which can be switched on and off which amplifies, during the read phase, the echo signals received by the high-frequency coil 11, an analog-to-digital converter 31 which converts the signal amplified by the amplifier 28 and demodulated by a subsequent quadrature demodulator 29 into a series of digital sampling values, and a memory 33 in which the digital values are stored. On the basis of the values stored, an arithmetic device 35 calculates, for example by Fourier transformation, the spatial spin distribution for display on a monitor 43.

The operation of the MR tomography apparatus will now be described in detail with reference to FIG. 4a. The last line in FIG. 4a represents the time axis, whilst the first line represents the variation in time of the high-frequency pulses. The high-frequency pulse is generated by the high-frequency generator 25. This generator includes (see FIG. 3) an amplifier 251 whose output can be coupled to the high-frequency coil 11, via the switching device 27, and whose input is connected to a mixing stage 252. The mixing stage 252 outputs a signal which is proportional to the product of the signals on its two inputs, one of which is connected to an envelope generator 253 whilst its other input is connected to an oscillator 254. The oscillator 254 is tuned to the Lamor frequency of the water-bound hydrogen protons (approximately 85 MHz for an induction of 2 Tesla of the steady field). The envelope generator 253 includes (not shown) a digital memory as well as a digital-to-analog converter which converts the output signal of the memory into analog values. The memory, controlled by the control unit 45, contains an envelope signal in the form of a series of digital sampling values.

The envelope signal is proportioned so that the high-frequency pulse, generated by multiplication of the envelope signal by the oscillator signal and amplified by the amplifier 251, has a flip angle of 20°, so that the magnetization in the examination region is deflected out of the z-direction through this angle.

The generator 19 is controlled by the central control unit 45 so that the coils 3 start to generate a gradient field Gz at the instant t=0, said gradient field having a predetermined value during the high-frequency pulse and decreasing to the value 0 subsequent to the high-frequency pulse (at the instant t=t1). By application of this gradient it is achieved that the high-frequency pulse excites only a layer or volume which extends perpendicularly to the z-axis, the thickness of said layer depending on the bandwidth of the high-frequency pulse and on the gradient of the magnetic field Gz. Because a slice or a volume is thus selected in the interval between t=0 and t=t1 this interval is also referred to as the selection phase.

The generators 19, 21 and 23 are controlled so that the three coil systems 3, 5 and 7 generate a magnetic gradient field Gz, Gy, Gx, respectively, during the subsequent phase. During this phase the gradient of the gradient field Gz opposes the gradient during the selection phase (0-t1). It is proportioned so that the time integral over the gradients from the centre of the high-frequency pulse until the instant t2 is equal to 0. Rephasing of the nuclear magnetization in the excited layer is thus achieved.

Furthermore, the generator 21 is controlled so that the gradient coils 5 generate a gradient field Gy during the interval t1–t2. This gradient field ensures that the phase of the magnetization depends on the spin distribution in the y-direction. Therefore, the interval t1–t2 is also referred to as the phase encoding or preparation phase. The magnitude of the gradient Gy differs for different sequences.

Finally, the generator 23 is also controlled by the control unit 45 so that the coils 7 generate a magnetic gradient field Gx (see sixth line of FIG. 4a) during the preparation phase. The purpose of this step will be described in detail hereinafter. At the end of the preparation phase, that is to say at the instant t=t2, all gradients fields Gx, Gy and Gz have the value zero.

During the next phase, the so-called read phase, only the generator 23 is controlled by the control unit 45, that is to say so that the sign of the gradient field Gx is reversed immediately after termination of the preparation phase (see sixth line). The gradient field Gx during the preparation phase dephases the nuclear magnetization in the examinatio region. Such dephasing is cancelled during the read phase, because the sign of the gradient field Gx is reversed. Thus, there is obtained an echo signal which reaches its maximum value at the instant t=t4, that is to say at the instant at which the time interval over the field Gx reaches the value zero. The echo signal is symmetrically sampled with respect to the instant t=t4 (see seventh line) and is converted into a series of digital sampling values.

In accordance with the invention, each sequence is repeated with the same high-frequency pulse (first line), the same selection gradient Gz (second line) and the same encoding gradient Gy (third line), but with a different read gradient Gx (fourth line) Gx. The variation of the gradient during repetition of the sequence is such that the maximum value of the echo occurs at the instant t=t5, i.e. a period of time T later (or earlier) than in the preceding execution of the sequence. This is achieved in that the gradient field is not immediately activated in the read phase when the seqence is repeated, but not until at the instant t=t3, as appears from the fourth line of FIG. 4a, where t3−t2=T. Accordingly, the echo signal is also sampled a period of time T later (see fifth line). The period of time T whereby the difference in time between the high-frequency pulse and said echo is increased or decreased must satisfy;

T=0.5/df where df is the difference between the water frequency and the fat frequency. This means that the period of time T must be equal to half the reciprocal value of the difference between the water frequency and the fat frequency. For a field of 2 Tesla, this difference amounts to approximately 281 Hz, so that half the reciprocal value of this difference amounts to approximately 1.8 ms.

It will be apparent that the shift of the echo over the period of time T with respect to the high-frequency pulse can also be realized in a different manner. One possibility of delaying the echo consists in reducing the gradient Gx during the read phase or in increasing this gradient during the preparation phase. The same result can also be obtained by reducing or increasing the duration of the gradient Gx during the preparation phase.

FIGS. 5a and 5b show the echo signal occurring during the first and the second sequence, respectively, at the instants t=t4 and t=t5, respectively, as a vector s in a u, v coordinate system which rotates at the Larmor frequency or the frequency of the oscillator 254, resulting in the phase shift of the signal s with respect to the oscillation produced by the oscillator 254.

As is denoted by broken lines, each of the two echo signals s is composed of a component sw which is influenced by the water distribution and a component sf which is influenced by the fat distribution. The phase position of the water component sw at the instant t=t4 during the first sequence is exactly the same as that at the instant t=t5 during the second sequence, because the frequency of the oscillator 254 corresponds to the Larmor frequency of water-bound hydrogen protons. However, the phase position of the fat component in the two diagrams deviates by 180°. Thus, the fat component could be eliminated by vectorial addition of the two signals s, whilst the water component could be eliminated by subtracting the two signals. The vectorial addition or subtraction is realized in known manner in that the signals su, corresponding to the projection of the signal s on the u-axis, are added (or subtracted) and the signals sv, corresponding to the projection of the vector s on the v-axis, are also added or subtracted, respectively, separately therefrom.

The signals su and sv are derived from the signal s in the demodulator 29. The demodulator 29 includes (see FIG. 3) two identical mixing stages 291, 292. The output signal of each mixing stage is proportional to the product of the signals on both their inputs. The other input of the mixing stage 291 is connected directly to the output of the oscillator 254 (or the output of an oscillator synchronized with respect thereto), whilst the other input of the mixing stage 292 is connected to the oscillator via a 90° phase shifter. The double-frequency signals which occur on the mixing stage outputs as a result of this mixing operation are suppressed by low-pass filters (not shown). As a result of this mixing operation, the filtered signals su and sv will not contain components having the oscillator frequency.

The low-frequency signals su and sv are converted into a respective series of digital sampling values by the analog-to-digital converter, after which they are stored. The sampling values are added to (or subtracted from) the sampling values of the corresponding series, resulting from the echo signal of the other sequence, so that two series of summed (or subtracted) sampling values are obtained. These series are subjected, together with the series resulting from further pairs of sequences with each time modified encoding gradients, to a Fourier transformation in known manner, so that for each pixel there are again obtained two components wherefrom the associated image value is determined by formation of the absolute value.

The time distance tr between two sequences may amount to 30 ms. Typically, the period of time elapsing between the beginning of one sequence and the beginning of the next sequence is smaller than 100 ms. After such a short period of time, the magnetization existing before the measurements and extending in the z-direction will not yet have been completely restored in the examination region. Therefore, the echo signal occurring during the sequence succeeding a first sequence will be smaller and will decrease from one sequence to another. After approximately 20 to 30 sequences, however, there will exist a stationary state after which the amplitude of the echo signal will no longer decrease significantly. When only the echo signals collected after the steady state has been reached are used for the reconstruction, no errors will occur. The signal-to-noise ratio then depends on the flip angle of the high-frequency pulse. The most favourable signal-to-noise ratio is obtained when the flip angle a satisfies the relationship:

$$a = \arccos(\exp(-tr/T1))$$

where T1 represents the longitudinal relaxation time. However, optimum contrast will generally be obtained only for large flip angles, so that usually a flip angle is used which is larger than the one resulting from the above formula but which is substantially smaller than 90°.

As has already been explained, for the formation of a water image the signals must be added when the oscillator frequency corresponds to the Larmor frequency of water-bound hydrogen protons. However, when the oscillator is tuned to the Larmor frequency of fat-bound hydrogen protons, the signals must be subtracted in order to form a water image (and added in order to form a fat image). However, the oscillator could also be tuned to a frequency between these two frequencies, for example exactly to the central frequency. The desired signals can then be obtained by shifting the phase of the oscillator oscillation applied to the demodulator 29 through 90° between the two executions which together form a pair.

The fourth line of FIG. 4a shows that it is not important for the gradient which precedes the read gradient in the opposite direction to be switched on and off during the preparation phase t1–t2. It is sufficient when it terminates at the instant t=t3. The distance in time between the beginning of the oscillation of the gradient field on the fourth line would then be an amount T larger than the corresponding distance on the sixth line. If the period of time T were substantially larger and/or the duration of said oscillation of the gradient field were substantially shorter, said distance on the fourth line could be larger than the corresponding distance on the sixth line by an amount equal to or larger than the duration of the oscillation on the sixth line. However, the two oscillations could then be contained in a single sequence as appears from FIG. 4b.

The version of the method described with reference to FIG. 4b includes in each sequence a high-frequency pulse in the period of time 0–t1 8as on the first line of FIG. 4a), and subsequently an encoding phase t1–t2 (if any) with a gradient field extending in the y-direction (as on line three of FIG. 4a), a field serving for layer selection then being active during the interval 0–t2 (see line two of FIG. 4a). Therefore, these parts of the sequence are not shown again in FIG. 4b. During the interval t1–t2 there is also applied a gradient G″x which has the opposite direction during the read phase t2–t3′, the time integral over G″x being zero from t1 until the centre of the read phase. During the read phase, the first echo signal formed is sampled (second line of FIG. 4b). The first read phase is followed by a period of time (t3′–t4′), during which the gradient field Gx again has the opposite signal with respect to the first read phase, which is followed by a second read phase (t4'-t5') during which the read gradient again has the same direction and the same time integral as during the first read phase and during which the second echo signal formed is sampled (second line of FIG. 4b). The distance in time between the centres of the two read phases then corresponds to the value T', subject to the relation:

$$T' = (2n-1)/(2df)$$

where n is an integer number larger than zero; preferably, n=1.

In comparison with the method described with reference to FIG. 4a, the present method has the advantage that the number of executions is only half as large; however, in comparison with the method described with reference to FIG. 4a, a loss of spatial resolution cannot be prevented unless the time integral over the gradients during the read phase is not modified. Therefore, as a rule this method can be used only when the period of time t' (for n=1) is sufficiently long. This is the case when the steady, uniform magnetic field is weaker, because the frequency difference df decreases proportion to the field strength. For a field of 0.5 tesla, the period of time T' already amounts of 7.1 s.

FIGS. 4a and 4b illustrate the invention with a variation in time of the gradient fields which is suitable for the so-called two-dimensional Fourier method. However, the invention can also be used for other methods, for example for the so-called projection reconstruction method where a plurality of gradient fields are switched during the encoding phase so that the amount of the gradient remains the same for all sequences, whilst the direction of the gradient is varied. The gradient should then extend each time in the opposite direction during the read phase. Similarly, the spin distribution can be determined in a three-dimensional volume, for example by means of the so-called three-dimensional Fourier method. The sequence in this method deviates from the sequence shown in the FIGS. 4a and 4b in that, in addition to the gradient field Gy, the gradient field Gz is also varied during the encoding phase.

It has been assumed thus far that first the executions of each sequence forming a pair are formed and that the sum of or the difference between the echo signals thus produced is formed. However, it is alternatively possible to form in known manner a first image from a series of sequences with each time the same distance between the high-frequency pulse and the echo signal (however, without forming the absolute value for the individual pixels). The same operation is performed for a second series comprising the same number of sequences in which, however, the distance between the high-frequency pulse and the echo pulse is larger or smaller by the period of time T, an image again being reconstructed therefrom (again without forming the absolute value for the image values of the individual pixels). Because the reconstruction methods, for example the Fourier reconstruction, are linear signal processing operations, the same result will be obtained as previously when the two images are added or subtracted one pixel after the other before formation of the absolute value. However, this method requires a larger storage capacity and a longer reconstruction time. On the other hand, a fat image as well as a water image can then be formed at a later stage.

What is claimed is:

1. An Mr tomography method wherein echo signals are extracted during a plurality of sequences for the reconstruction of the spatial density distribution in an examination region, each execution of a sequence including a selection phase during which a single high-frequency pulse is applied to the examination region in the presence of a magnetic gradient field, a subsequent encoding phase during which the examination region is exposed to a magnetic gradient field with a gradient which varies as regards magnitude or direction from one sequence to another, and a subsequent read phase during which the spin echo signal generated in the examination region is sampled in the presence of a magnetic gradient field, after which an image which is dependent on the proton distribution is calculated from the echo signal, the image values for the individual pixels of the image being determined by formation of the absolute value during a final step, characterized in that each sequence is executed twice, the gradient field (Gx) during the read phase in the second execution of each sequence, or the gradient field previously extending in the opposite direction, being proportioned so that the distance in time between the high-frequency pulse and the echo signal in the second execution is shifted with respect to the first sequence over a period of time (T) which corresponds to half the reciprocal value of the difference between the Larmor frequencies (df) of water-bound and fat-bound hydrogen protons, respectively, an image of the density distribution in the examination region being calculated from the sums of or the differences between the echo signals formed during the two executions of the sequences.

2. An MR tomography method wherein echo signals are extracted during a plurality of sequences for the reconstruction of the spatial density distribution in an examination region, each execution of a sequence including a selection phase during which a single high-frequency pulse is applied to the examination region in the presence of a magnetic gradient field, a subsequent encoding phase during which the examination region is exposed to a magnetic gradient field with a gradient which varies as regards magnitude or direction from one sequence to another, and a subsequent read phase during which the spin echo signal generated in the examination region is sampled in the presence of a magnetic gradient field, after which an image which is dependent on the proton distribution is calculated from the echo signal, the image values for the individual pixels of the image being determined by formation of the absolute value during a final step, characterized in that each sequence includes two read phases (t2-t3', t4'-t5') during which the gradient field has the same direction, each of the read phases being preceded by a period of time during which the gradient field extends in the opposite direction with respect to its direction during the read phase, the variation in time of the gradient field (Gx) being chosen so that the echo signal occurring during the second read phase is shifted with respect to the echo signal occurring the first read phase over a period of time (T') which corresponds to half the reciprocal value of the difference between the Larmor frequencies (df) of water-bound and fat-bound hydrogen protons, respectively, or to an odd multiple thereof, an image of the density distribution in the examination region being calculated from the sums of or the differences between the echo signals formed during the two read phases.

3. A method as claimed in claim 1, characterized in that the gradient field has the same magnitude during the read phase of both executions of a sequence, the distance in time between the gradient field and the high-frequency pulse in one sequence exceeding that in the other sequence by a period of time (T) which amounts to half the reciprocal value of the difference between the Larmor frequencies of water-bound and fat-bound hydrogen protons, respectively.

4. A method as claimed in claim 1, characterized in that during the read phase the gradient field in one sequence is lrger than that in the other sequence.

5. A method as claimed in any one of claims 1, 2, 3 or 4, characterized in that the flip angle of the high-frequency pulse is smaller than 90°, the period of time elapsing between the beginning of a sequence and the beginning of the next sequence being smaller than 100 ms, the echo signals which occur before the magnetization has reached a steady state being suppressed.

6. An appartatus for performing the method claimed in claim 1, including means (1) for generating steady, uniform magnetic field, a high-frequency coil system (11) for generating high-frequency pulses, gradient coils (3, 5, 7) for generating magnetic fields which extend in the direction of the steady field and which have gradients in the same direction as well as in the direction perpendicular thereto, a sampling device (28 . . . 31) for receiving echo signals generated in an examination region, a control unit (45) for controlling the gradient coils, the high-frequency ccoil system and the sampling device, as well as a reconstruction unit (35) which calculates an image of the spatial spin distribution from the echo signals, characterized in that the control unit (45) is programmed so that each sequence is executed twice, the gradient coils (3, 5, 7) being controlled so that the distance between the echo signals and the high-frequency pulse is shifted over a period of time (T) which corresponds to half the reciprocal value of the difference between the fat frequency and the water frequency, the reconstruction unit (35) being constructed so that it determines the image on the basis of the sum or the difference between the echo signals.

7. An apparatus for performing the method claimed in claim 2, including means (1) for generating a steady, uniform magnetic field, a high-frequency coil system (11) for generating high-frequency pulses, gradient coils (3, 5, 7) for generating magnetic fields which extend in the direction of the steady field and which have gradients in the same direction as well as in the direction perpendicular thereto, a sampling device (28 . . . 31) for receiving echo signals generated in an examination region, a control unit (45) for controlling gradient coils, the high-frequency coil system and sampling device, as well as a reconstruction unit (35) which calculates an image of the spatial spin distribution from the echo signals, characterized in that the control unit is programmed so that each sequence includes two read phases (t2–t3'; t4'–t4'–t5') during which the gradient field has the same direction, each of the read phases being preceded by a period of time during which the gradient field extends in the opposite direction with respect to its direction during the read phase, the variation in time of the gradient field (Gx) being chosen so that the echo signal occurring during the second read phase is shifted with respect to the echo signal occurring during the first read phase over a period of time (T') which corresponds to half the reciprocal value of the difference between the Larmor frequencies (df) of water-bound and fat-bound hydrogen protons, respectively, or to an odd multiple thereof, the reconstruction unit (35) being constructed so that it determines the image on the basis of the sum of or the difference between the echo signals.

* * * * *